(12) United States Patent
Lee et al.

(10) Patent No.: US 7,833,633 B2
(45) Date of Patent: Nov. 16, 2010

(54) FULL COLOR ORGANIC ELECTROLUMINESCENCE DISPLAY DEVICE

(75) Inventors: Jun-Yeob Lee, Seongnam-si (KR); Yong-Joong Choi, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1027 days.

(21) Appl. No.: 10/903,697

(22) Filed: Jul. 29, 2004

(65) Prior Publication Data

US 2005/0112402 A1    May 26, 2005

(30) Foreign Application Priority Data

Nov. 26, 2003    (KR) .................. 10-2003-0084749

(51) Int. Cl.
 H01L 29/20   (2006.01)
 B05D 5/06    (2006.01)
 H01J 1/62    (2006.01)
 H05B 33/00   (2006.01)

(52) U.S. Cl. .................. 428/690; 428/917; 313/504; 313/506; 257/89; 257/90; 257/102; 257/103; 427/66

(58) Field of Classification Search .................. 428/690, 428/917; 313/504, 506; 427/66
See application file for complete search history.

(56) References Cited

U.S. PATENT DOCUMENTS

| 5,220,348 A | 6/1993 | D'Aurelio |
| 5,256,506 A | 10/1993 | Ellis et al. |
| 5,278,023 A | 1/1994 | Bills et al. |
| 5,308,737 A | 5/1994 | Bills et al. |
| 5,909,081 A | 6/1999 | Eida et al. |
| 5,937,272 A | 8/1999 | Tang |
| 5,998,085 A | 12/1999 | Isberg et al. |
| 6,013,982 A | 1/2000 | Thompson et al. |
| 6,097,147 A | 8/2000 | Baldo et al. |
| 6,252,253 B1 * | 6/2001 | Bao et al. .................. 257/89 |
| 6,281,634 B1 | 8/2001 | Yokoyama |
| 6,303,238 B1 | 10/2001 | Thompson et al. |

(Continued)

FOREIGN PATENT DOCUMENTS

CN    1212114 A    3/1999

(Continued)

OTHER PUBLICATIONS

Korean Patent Abstracts, Publication No. 1020030019897; Publication Date: Jul. 3, 2003; in the name of Kazuo et al.

(Continued)

*Primary Examiner*—D. Lawrence Tarazano
*Assistant Examiner*—Camie S Thompson
(74) *Attorney, Agent, or Firm*—Christie, Parker & Hale, LLP (57) ABSTRACT

Disclosed is a full color organic electroluminescence display device, comprising a substrate; a first electrode; organic film layers including red, green and blue emission layers and an electron transporting layer; and a second electrode. The thickness of the electron transporting layer, which is preferably formed as a common layer, is different in the red and green emission regions from that in the blue emission region so that the device has an excellent purity of color and improved luminous efficiency of red and green colors.

16 Claims, 7 Drawing Sheets

U.S. PATENT DOCUMENTS

| | | | |
|---|---|---|---|
| 6,310,360 B1 | 10/2001 | Forrest et al. | |
| 6,384,529 B2 | 5/2002 | Tang et al. | |
| 6,429,585 B1 * | 8/2002 | Kitazume et al. | 313/505 |
| 6,520,819 B1 * | 2/2003 | Sakaguchi | 445/24 |
| 6,541,130 B2 * | 4/2003 | Fukuda | 428/690 |
| 6,614,175 B2 * | 9/2003 | Aziz et al. | 313/504 |
| 6,835,469 B2 | 12/2004 | Kwong et al. | |
| 6,863,961 B2 | 3/2005 | Miyashita et al. | |
| 6,876,144 B2 | 4/2005 | Peng | |
| 6,891,326 B2 | 5/2005 | Lu | |
| 6,917,159 B2 | 7/2005 | Tyan et al. | |
| 7,012,377 B2 | 3/2006 | Yuki | |
| 7,034,339 B2 | 4/2006 | Matsuura et al. | |
| 7,067,985 B2 | 6/2006 | Adachi | |
| 7,189,466 B2 | 3/2007 | Moriyama et al. | |
| 2002/0050786 A1 | 5/2002 | Yamazaki et al. | |
| 2003/0042848 A1 | 3/2003 | Park et al. | |
| 2004/0169461 A1 | 9/2004 | Moriyama et al. | |
| 2004/0258954 A1 | 12/2004 | Takasu et al. | |
| 2005/0057150 A1 | 3/2005 | Kim et al. | |
| 2005/0112403 A1 | 5/2005 | Ju et al. | |
| 2005/0184653 A1 | 8/2005 | Suh et al. | |
| 2006/0105201 A1 | 5/2006 | Lee et al. | |
| 2006/0177694 A1 | 8/2006 | Kamatani et al. | |

FOREIGN PATENT DOCUMENTS

| | | |
|---|---|---|
| CN | 1242134 A | 1/2000 |
| JP | 9-115669 | 5/1997 |
| JP | 11-204258 | 7/1999 |
| JP | 2001-250694 | 9/2001 |
| JP | 2002-75645 | 3/2002 |
| JP | 2002-184581 | 6/2002 |
| JP | 2002-260858 | 9/2002 |
| JP | 2003-151776 | 5/2003 |
| KR | 2000-0062303 | 10/2000 |
| KR | 2003-0019897 | 3/2003 |
| KR | 2003-0020034 | 3/2003 |
| KR | 10-2003-0084238 | 11/2003 |
| WO | WO 02/44189 A1 | 6/2002 |
| WO | WO 03/017730 A1 | 2/2003 |

OTHER PUBLICATIONS

Office Action for KR 10-2003-0084749 dated Jan. 26, 2006.
Korean Office action dated Sep. 27, 2005 for Korean patent application 10-2003-0063752, priority document to U.S. Publication 2005/0057150.
Patent Abstracts of Japan, Publication No. 2003-151776, dated May 23, 2003, in the name of Tetsuya Kato et al.
Patent Abstracts of Japan, Publication No. 2001-250694, dated Sep. 14, 2001, in the name of Junichi Sano.
Patent Abstracts of Japan, Publication No. 2002-184581, dated Jun. 28, 2002, in the name of Sukeyuki Fujii.
Patent Abstracts of Japan, Publication No. 2002-260858, dated Sep. 13, 2002, in the name of Mikiko Matsuo.
Korean Patent Abstract, Publication No. 1020030020034 A, dated Mar. 8, 2003, in the name of Hui Seok Bang et al.
Japan Patent Abstracts, Publication No. 11-204258, dated Jul. 30, 1999, in the name of Yasunori Kijima et al.
Ikai, M., et al., *Highly efficient phosphorescense from organic light-emitting devices with an excition-block layer*, Applied Physics Letters, vol. 79, No. 2, Jul. 9, 2001, pp. 156-158.
English translation of priority KR 10-2003-0084238, listed above, for U.S. Publication 2005/0112403.
Chinese Office action for Chinese Patent Application CN2004100786519, dated Oct. 19, 2007, with an English translation.
Patent Abstracts of Japan, Publication No. 09-115669, dated Feb. 5, 1997, in the name of Yoshinobu Ueha et al.
Patent Abstracts of Japan, Publication No. 2002-075645, dated Mar. 15, 2002, in the name of Takeshi Nishi et al.
Office Action, with English translation, dated Aug. 31, 2007 for corresponding Chinese Patent Application No. 200410085026.7.
U.S. Office action dated Mar. 31, 2008, for related U.S. Appl. No. 10/938,471, indicating relevance of U.S. Patent listed in this IDS.
U.S. Office action dated May 11, 2007, for related U.S. Appl. No. 10/980,090, indicating relevance of U.S. Publications listed in this IDS.
U.S. Office action dated May 27, 2009, for related U.S. Appl. No. 10/938,471, noting listed U.S. Patent 5,909,081 in this IDS.
U.S. Office action dated Feb. 23, 2010, for related U.S. Appl. No. 12/559,459, noting listed reference in this IDS.

* cited by examiner

FULL COLOR ORGANIC ELECTROLUMINESCENCE DISPLAY DEVICE

CROSS-REFERENCE TO RELATED APPLICATION

This application claims priority of and the benefit of Korean Patent Application No. 2003-84749, filed on Nov. 26, 2003, the entire disclosure of which is incorporated herein by reference.

BACKGROUND OF THE INVENTION

1. Field of the Invention

The present invention relates to a full color organic electroluminescence display device, wherein an electron transporting layer, which is applied to organic layers as a common layer, is formed with a first thickness in the red and green emission layer regions and with a second thickness, which is different from the first thickness, in the blue emission layer region so that it has a high purity of color, as well as improved red and green color efficiency.

2. Description of the Related Art

In general, an organic electroluminescence display device realizes colors based on the principle that holes and electrons, which are injected from an anode and a cathode, are recombined in an emission layer to emit light. Thus, it has a layered structure having an emission layer inserted between the anode and the cathode. However, such a structure cannot provide high luminous efficiency. Accordingly, an electron injecting layer, an electron transporting layer, a hole transporting layer, a hole injecting layer, and the like are selectively added and inserted between respective electrodes and emission layers.

Specifically, a full color organic electroluminescence display device has an emission layer, on which red (R), green (G), and blue (B) pixelregions are formed, to implement full color. Although various emission substances have been developed to implement full color, and can exhibit a high purity of color, there have been found few red, green and blue emission substances which are suitable for full color organic electroluminescence display devices and thus, research continues to develop new substances. As a result of research on the structural aspects of organic electroluminescence display devices for implementing full color, it has also been suggested to use a color conversion layer or a color filter in the organic electroluminescence display device.

However, there has been no organic electroluminescence display device which can implement full color in a fully satisfactory level. This is due to a practical difficulty in forming a fine pattern of an organic thin film, such as an emission layer, an electron injecting layer, and a hole transporting layer, as well as due to difficulty in obtaining the high purity of color due to the differences in luminous efficiency between red, green and blue colors depending on the layers.

Figure 1:
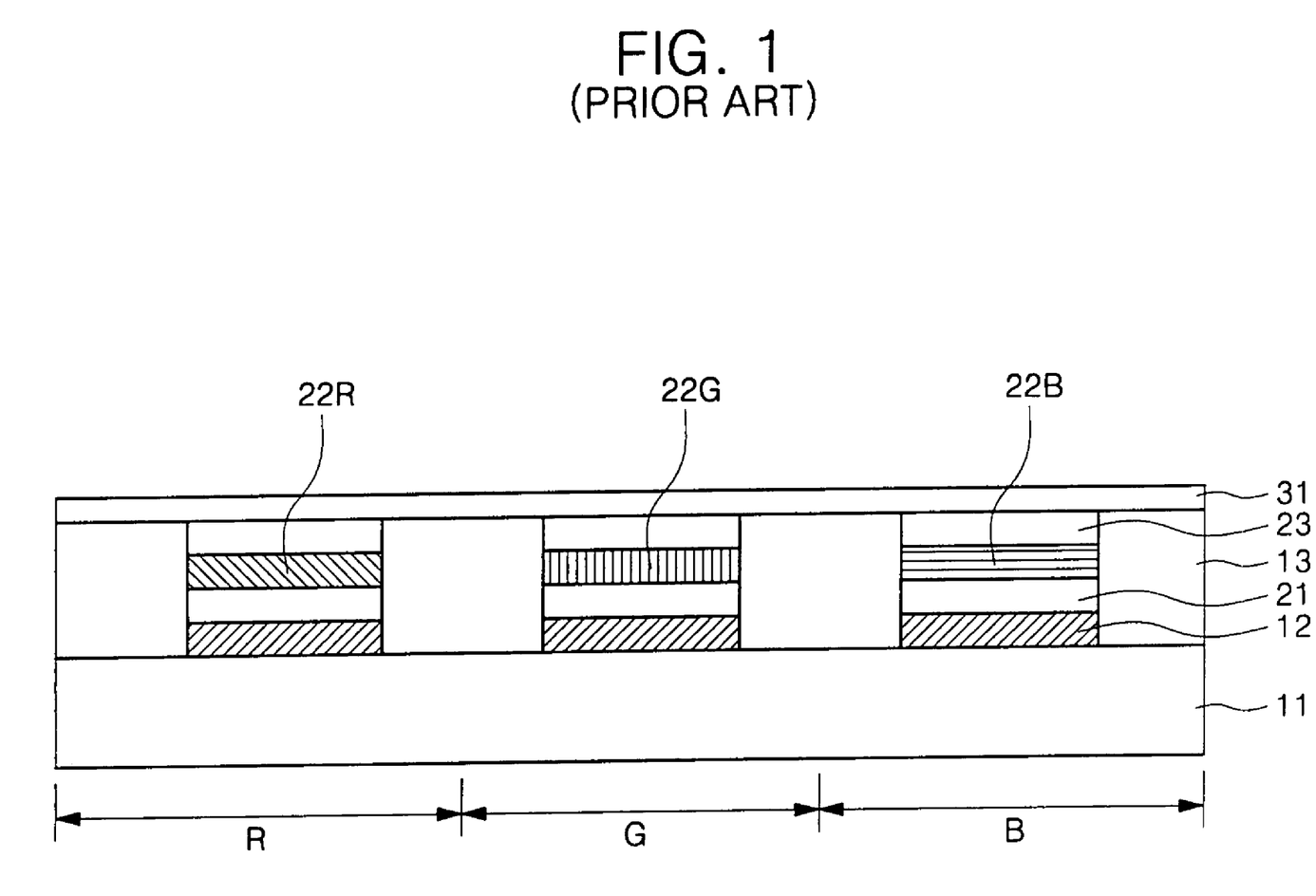
FIG. 1 is a cross-sectional view showing a conventional full color organic electroluminescence display device in which the electron transporting layers are isolated from one another.

FIG. 1 is a cross-sectional view showing the structure of a conventional full color organic electroluminescence display device.

Referring to FIG. 1, anode electrodes 12 are deposited and patterned on a substrate 11. The anode electrodes 12 define pixel regions R, G, B using insulating layers 13. As organic layers, hole transporting layers 21 are formed on the pixel regions R, G, B by, for example, vacuum deposition. Red, green and blue emission substances are deposited on the hole transporting layers 21 and patterned to form red, green and blue emission layers 22R, 22G, 22B. Electron transporting layers 23 are then formed on the red, green and blue emission layers 22R, 22G, 22B. Finally, a cathode electrode 31 is deposited on the entire surface of the substrate to complete a full color organic electroluminescence display device.

The full color organic electroluminescence display device, as configured above, has a structure in which its anode electrodes 12; hole transporting layers 21; red, green and blue emission layers 22R, 22G, 22B; electron transporting layers 23; and cathode electrode 31 are isolated in respective color regions by the insulating layers 13. To manufacture a full color organic electroluminescence display device with such a structure, however, the hole transporting layers 21 and the electron transporting layers 23 should be separately formed for each respective color through a number of processes.

In an effort to solve such a problem, U.S. Pat. No. 6,281,634 (the disclosure of which is hereby incorporated herein by reference in its entirety) discloses a method wherein the anodes and the red, green and blue emission layers are separately formed for each respective color, while an electron transporting layer, a hole transporting layer, and a cathode are formed as common layers on the entire surface of the substrate.

Figure 2:
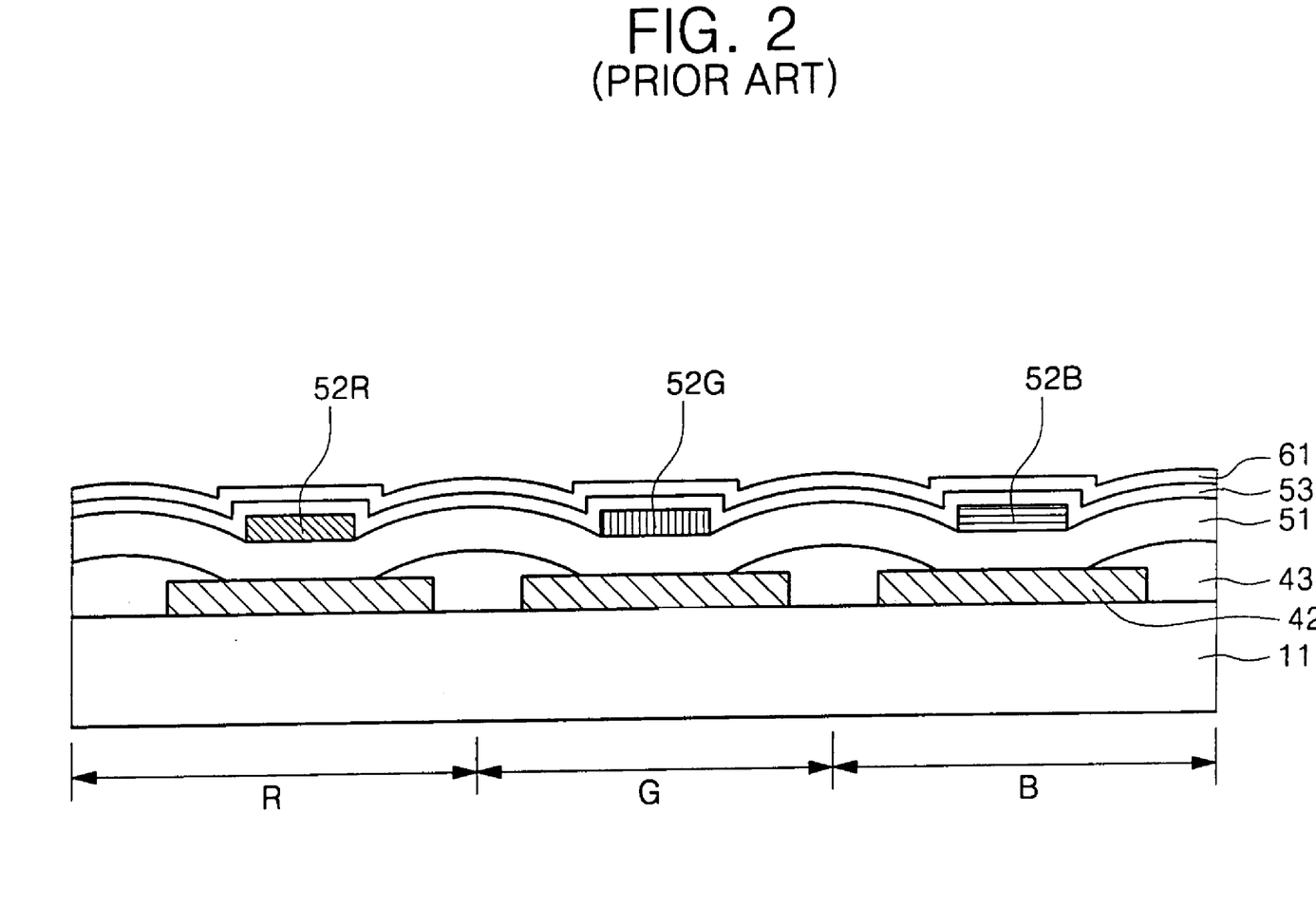
FIG. 2 is a cross-sectional view showing a conventional full color organic electroluminescence display device in which the electron transporting layer is applied as a common layer.

FIG. 2 is a cross-sectional view showing the structure of the full color organic electroluminescence display device disclosed in the above U.S. patent.

Referring to FIG. 2, the full color organic electroluminescence display device has a structure in which, on a substrate 11, first electrode layers 42, which act as anode electrodes; a hole transporting layer 51; red, green and blue emission layers 52R, 52G, and 52B; an electron transporting layer 53; and a second electrode layer 61, which acts as a cathode electrode, are formed successively. The hole transporting layer 51 and the electron transporting layer 53 are formed as common layers through the entire substrate.

The full color organic electroluminescence display device, as configured above, is manufactured as follows: the first electrode layers 42 are formed on the substrate 11 through patterning; pixel regions R, G, and B are defined using insulating layers 43; a hole transporting layer 51 is formed as a common layer on the first electrode layers 42 on the entire surface of the substrate; red, green and blue emission layers 52R, 52G, and 52B are patterned and stacked on the hole transporting layer 51; an electron transporting layer 53 is formed as a common layer on the red, green and blue emission layers 52R, 52G, and 52B; and finally a second electrode layer 61 is formed on the entire surface of the substrate. The method disclosed in the above patent is advantageous in that, contrary to conventional methods where the hole transporting layers 21 and the electron transporting layers 23 are formed in an isolated structure, the hole transporting layer 51 and the electron transporting layer 53 are applied as common layers. This simplifies the manufacturing process.

Such an application of the electron transporting layer 53 as a common layer, however, requires consideration on the efficiency and chromaticity coordinates of the red, green and blue emission layers 52R, 52G, and 52B. As is known in the industry, an interference phenomenon between light which is directly emitted via the emission layers 52R, 52G, and 52B, and light which is reflected by an electrode, exhibits excellent chromaticity coordinates from an optical point of view when an organic layer has a very small thickness or a specific thickness of 100 nm or more. However, if the electron transporting layer 53 has a large thickness the driving voltage increases, and thus, the optimal thickness for the electron transporting layer for the blue color is fairly thin.

Such a structure, which is optimized for blue color, is related with the blue emission substance. Specifically, although conventional phosphorescent emission substances may be used for red and green emission, they have too low a luminous efficiency to be used for blue emission and thus cannot be used for a high purity of color. Accordingly, fluorescent substances, which emit light in a manner different from that of the phosphorescent emission substances, are mainly used. A hole blocking layer (not shown) may be formed on the emission layers using a substance, which is similar to the electron transporting layer 53, to block any movement of holes, so that the full color organic electroluminescence display device, which includes emission layers 52R, 52G, and 52B as shown above, can exhibit high purity of color. If the hole blocking layer is formed on the blue emission substance, however, the blue luminous efficiency is deteriorated. Accordingly, the hole blocking layer should be formed except on the blue emission region B.

As such, the blue color has difficulty exhibiting high purity of color, unlike the other colors, and is sensitive to the electron transporting layer 53, which is stacked on the blue emission region B. Accordingly, the thickness of the electron transporting layer 53 of the full color organic electroluminescence display device should be determined in consideration of the blue emission substance. This results in a problem in that it is difficult to design a structure which is both optimized for the red and green emission layers 52R and 52G, and to maximize the efficiency characteristics of red and green colors.

For a full color organic electroluminescence display device with a structure as shown in FIG. 1, the electron transporting layers 23 are separately stacked on respective pixel regions R, G, and B. As a result, the device can be optimized for the characteristics of the emission layers 22R, 22G, and 22B. However, in the case of the full color organic electroluminescence display device, which has a structure as shown in FIG. 2, the electron transporting layer 53 is stacked as a common layer on respective emission layers 52R, 52G, and 52B with the same thickness. Therefore, the luminous efficiency of each of the emission layers may be deteriorated, due to the thickness of the electron transporting layer 53.

SUMMARY OF THE INVENTION

Accordingly, in an embodiment of the present invention, a full color organic electroluminescence display device is provided that exhibits a high purity of color.

In another embodiment of the present invention, a full color organic electroluminescence display device is provided having improved luminous efficiency of red and green colors.

In still another embodiment of the present invention, a full color organic electroluminescence display device is provided comprising: a substrate; a first electrode layer formed on the substrate; red, green and blue emission layers formed on the first electrode layer; an electrode transporting layer which is formed on the emission layers on the entire surface of the substrate with a first thickness in the red and green emission regions and a second thickness, different from the first thickness in the blue emission region; and a second electrode layer formed on the electron transporting layer.

According to an embodiment of the present invention, the electron transporting layer is formed as a common layer on the entire surface of the substrate.

According to another embodiment of the present invention, the electron transporting layer has a thickness of 30-40 nm in the red and green emission regions and a thickness of 15-30 nm in the blue emission region.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout the specification.

Figure 3:
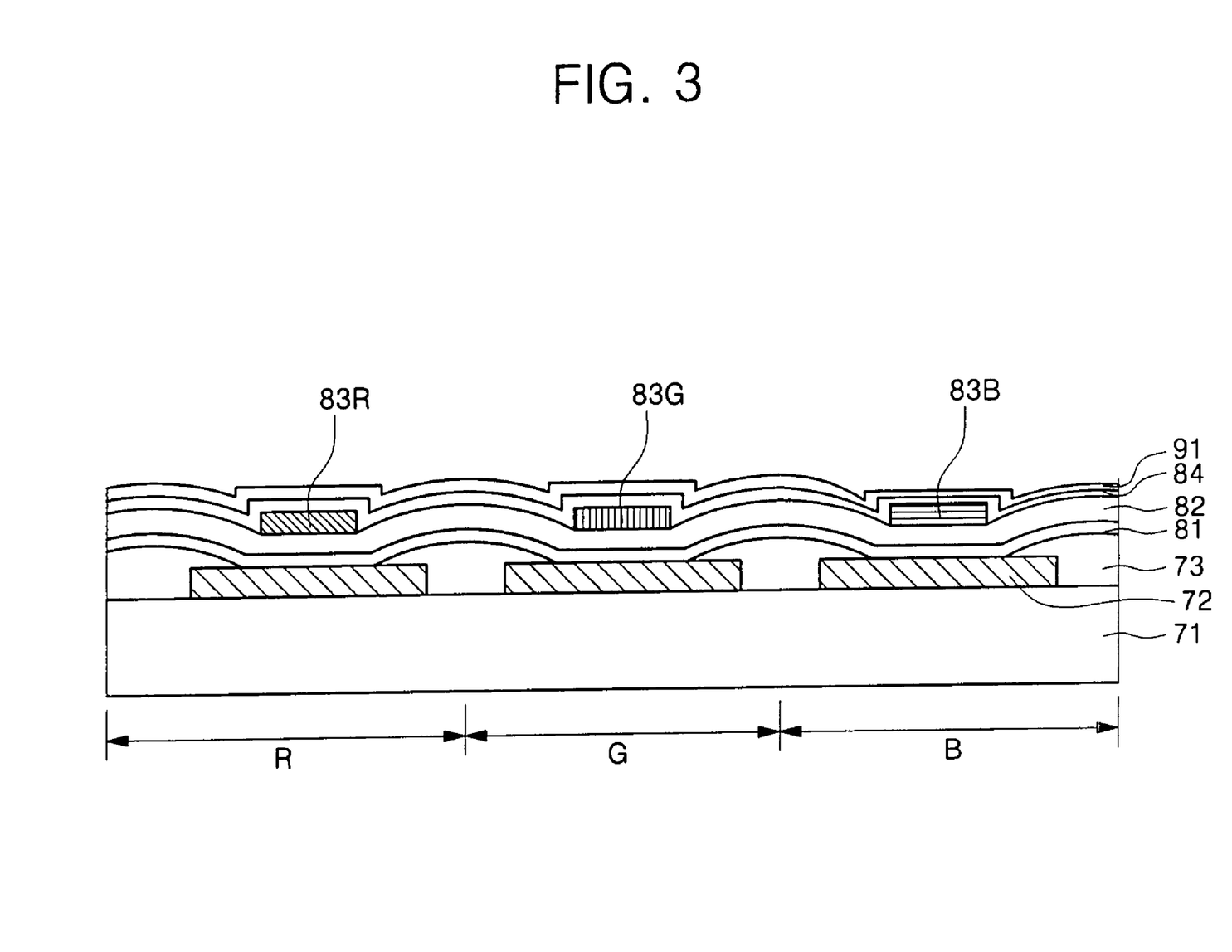
FIG. 3 is a cross-sectional view showing a full color organic electroluminescence display device according to the present invention.

FIG. 3 is a cross-sectional view showing the structure of a full color organic electroluminescence display device according to an embodiment of the present invention.

Referring to FIG. 3, first electrode layers 72, which act as anode electrodes, are formed and patterned on an insulating substrate 71, which is made of a material such as silicon oxide ($SiO_2$), glass, or plastic. Insulating layers 73 are positioned between the first electrode layers 72 to define respective pixel regions R, G, and B. A hole injecting layer 81 is formed as a common layer over the first electrode layer 72 and a hole transporting layer 82 is formed as a common layer over the hole injecting layer.

Organic film layers, including red, green and blue emission layers 83R, 83G, and 83B are positioned over the hole transporting layer 82 above the first electrodes corresponding to the R, G. and B pixel regions, respectively. Over the emissions layers is a common electron transporting layer 84. The electron transporting layer 84 is formed on the entire surface of the substrate as a common layer and has a thickness of 30-40 nm in the red and green regions R, G and a thickness of 15-30 nm in the blue emission region B. If the electron transporting layer 84 has a thickness, in the blue emission region B, that is outside the above range, it is difficult to obtain a desired range for the blue chromaticity coordinate. According to experiments on various effects of modified thicknesses for the electron transporting layer, it has been confirmed that, if the thickness is below 15 nm, the stability of the device is deteriorated and if the thickness is above 30 nm, the chromaticity coordinate thereof are deteriorated. Specifically, if the thickness of the electron transporting layer, according to the present invention, is 20 nm, the chromaticity coordinate is (0.15, 0.15). However, if the thickness is 30 nm, the chromaticity coordinate is (0.15, 0.17) and, if the thickness if 40 nm, the chromaticity coordinate is (0.15, 0.18). This shows the deterioration of the chromaticity coordinate.

A second electrode layer 91 is then formed on the electron transporting layer 84 on the entire surface of the substrate.

The first electrode layer 72 is made of a metal film, which is a reflective film, for a top-emitting structure and is made of a material such as ITO or IZO for a transparent electrode for a bottom-emitting structure. The second electrode layer 91 is made of a transparent electrode for a top-emitting structure and for a bottom-emitting structure has a structure wherein a transparent electrode substance is stacked on a metallic substance, which is a reflective film, or on a reflective plate. If the first electrode layer 72 is a cathode electrode, the second electrode layer 91 is an anode electrode and, if the first electrode layer 72 is an anode electrode, the second electrode layer 91 is a cathode electrode layer.

Furthermore, the organic film layers of the full color organic electroluminescence display device of the present invention may further include a hole injecting layer (HIL) 81, and a hole transporting layer (HTL) but such layers are not essential. Furthermore, a hole blocking layer (HBL; not shown), and an electron injecting layer (EIL; not shown), may be provided if necessary. When the first electrode layer 72 is the anode electrode, the organic film layers are stacked in the order of: a hole injecting layer; a hole transporting layer 82; red, green and blue emission layers 83R, 83G, 83B; a hole blocking layer; an electron transporting layer 84; and an electron injecting layer. When the first electrode layer 72 is the cathode electrode, the organic layers are stacked in the opposite order.

The full color organic electroluminescence display device according to the present invention, which adapts a structure as mentioned above, can exhibit a high purity of color and has improved red and green luminous efficiency compared to conventional devices.

A method for manufacturing of a full color organic electroluminescence display device according to a first embodiment of the present invention will now be described. FIGS. 4A to 4D show a method for manufacturing a full color organic electroluminescence display having the structure shown in FIG. 3, wherein a first electrode layer 72 is an anode electrode and a second electrode layer 91 is a cathode electrode.

Figure 4A:
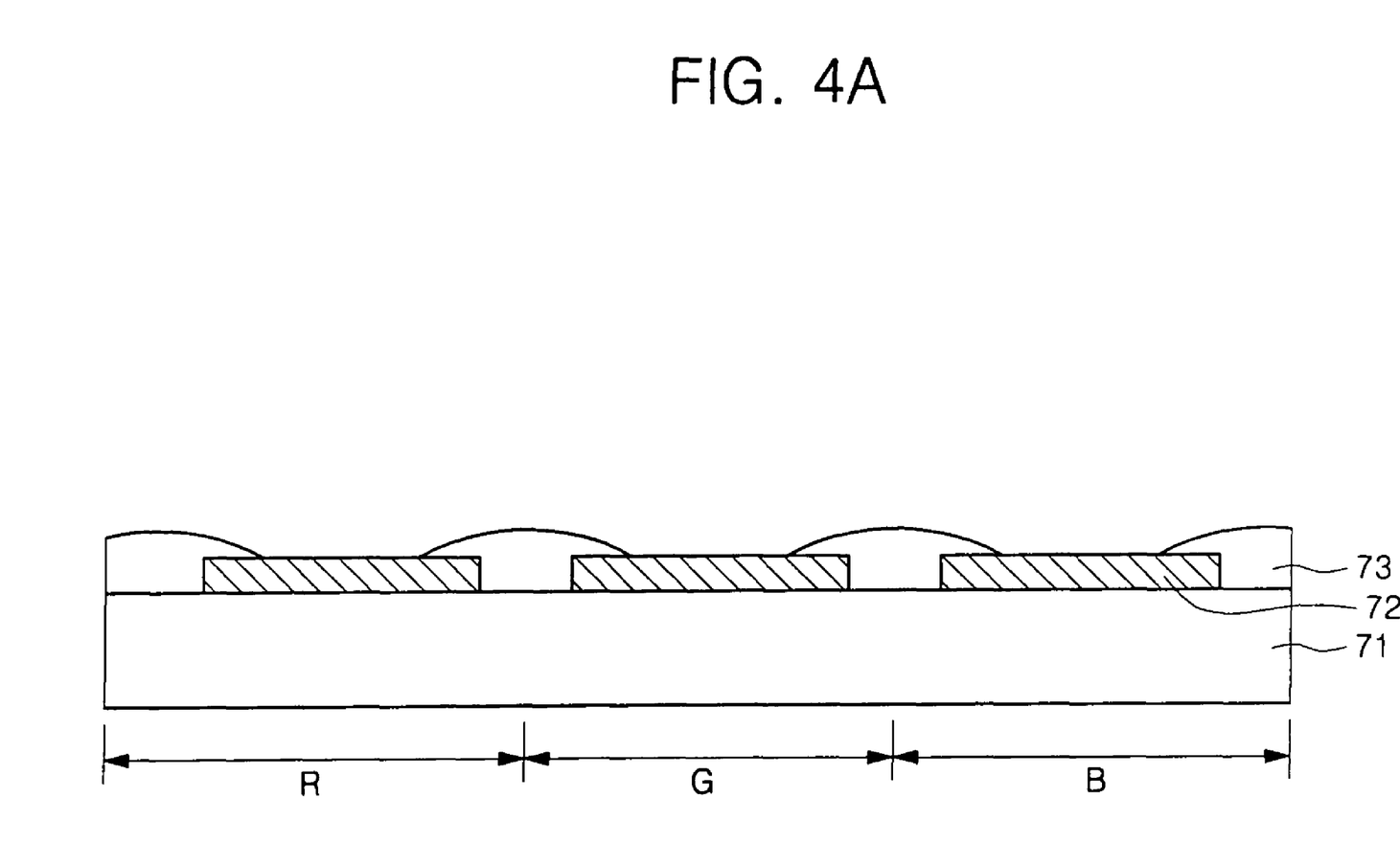
FIGS. 4A to 4D are cross-sectional views showing the steps in a method for manufacturing a full color organic electroluminescence display having a structure as in FIG. 3.

Referring to FIG. 4A, a first electrode layer 72 is formed and patterned on a substrate 71, which is made of a material such as silicon oxide (SiO$_2$), glass, or plastic, and an isolating layer 73 is formed thereon to define pixel regions, including red, green and blue pixel regions R, G, and B.

Figure 4B:
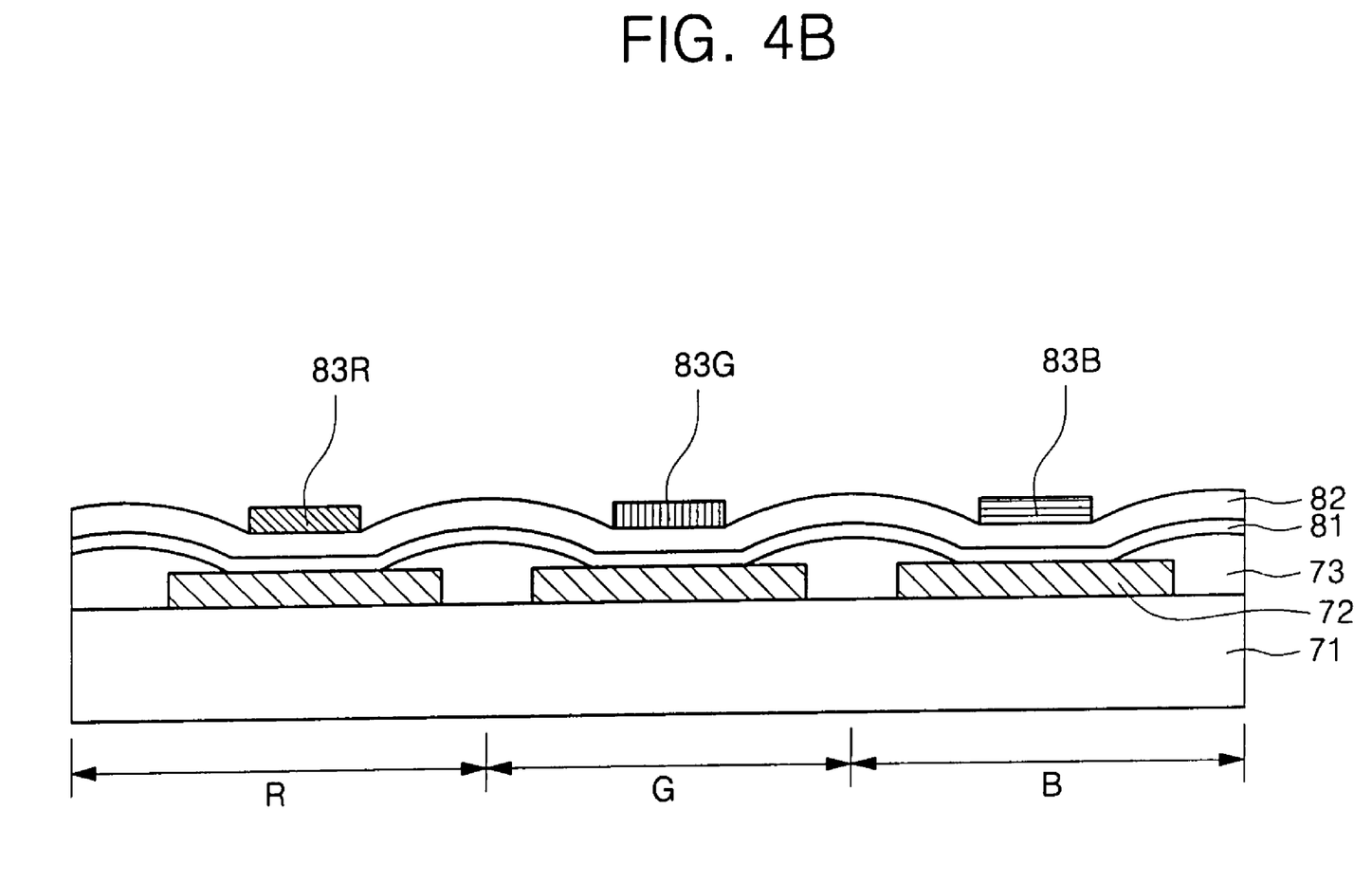

Referring to FIG. 4B, a hole injecting layer 81 and a hole transporting layer 82 are formed as common layers on the first electrode layer 72 on the entire surface of the substrate 71 and red, green and blue emission substances are patterned on the hole transporting layer 82 to form red, green and blue emission regions 83R, 83G, and 83B.

The hole injecting layer 81 is commonly made of a low-molecular compound, such as CuPc, TNATA, TCTA, TDAPB, and a high-molecular compound, such as PANI, PEDOT. The hole transporting layer 82 is commonly made of an aryl amine-based, hydrazone-based, stilbene-based, or starburst-based low-molecular compound, such as NPB, TPD, s-TAD, MTADATA, and a carbazole-based, aryl amine-based, perylene-based, or pyrol-based high-molecular compound, such as PVK. The hole injecting layer 81 and the hole transporting layer 82 are formed using, for example, vacuum deposition or sputtering.

The red emission substance may be formed of a low-molecular substance, such as Alq3, CBP, and a PFO-based or PPV-based high-molecular substance. The green emission substance may be formed of a low-molecular substance, such as Alq3, BGP, and a PFO-based or PPV-based high-molecular substance. The blue emission substance may be formed of substances which are commonly used in the field, for example, a low-molecular substance, such as DPVBi, spiro-DPVBi, spiro-6P, distyrylbenzene (DSB), distyrylarylene (DSA), and a PFO-based, or PPV-based high-molecular substance.

Figure 4C:
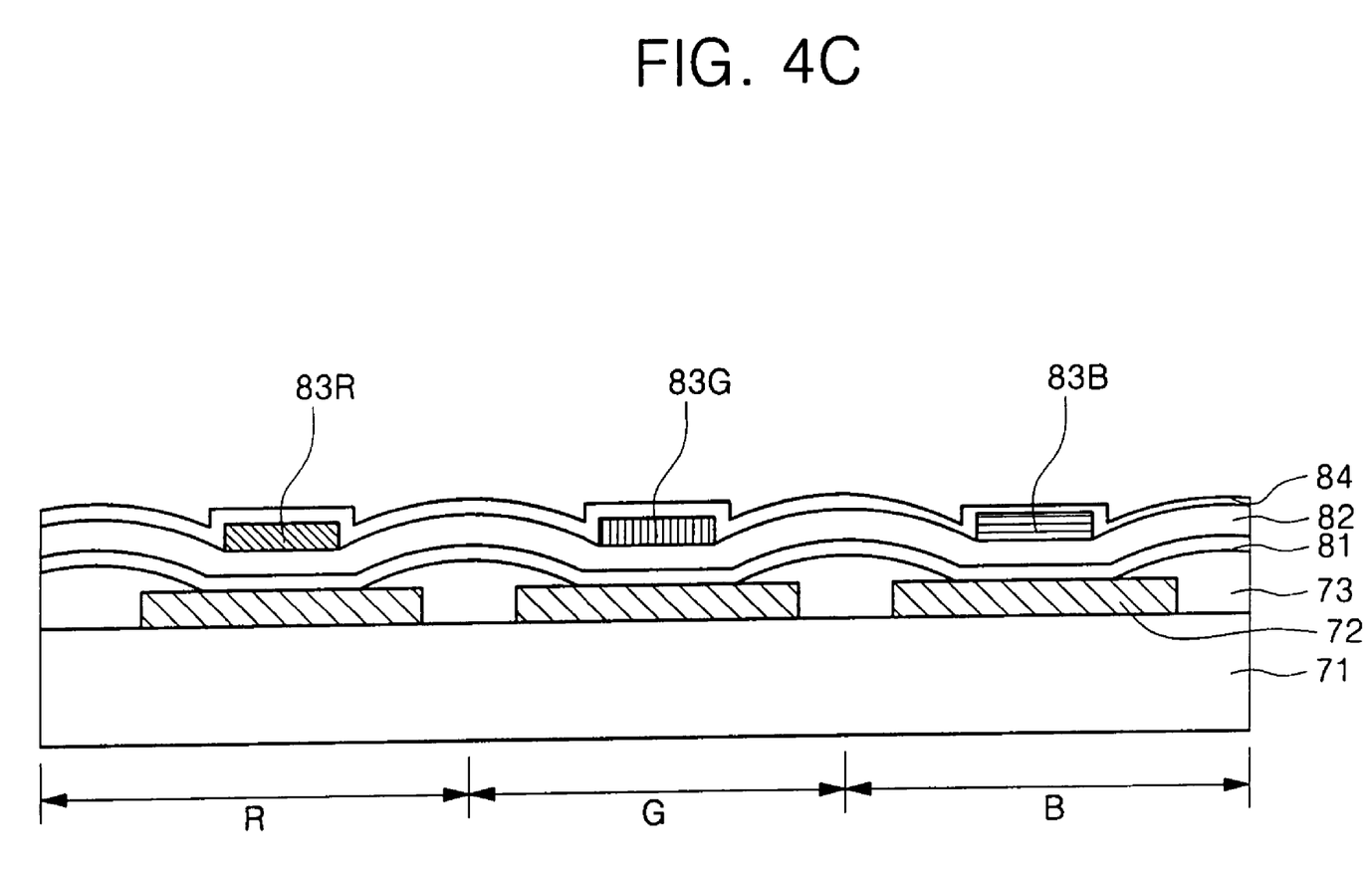

Referring to FIG. 4C, an electron transporting layer 84 is formed as a common layer on the red, green and blue emission layers 83R, 83G, and 83B on the entire surface of the substrate 71. Considering the driving voltage, the electron transporting layer 84 has a thickness of 30-40 nm in the red and green emission regions R, G, and a thickness of 15-30 nm in the blue emission region so that respective emission substances can exhibit an appropriate chromaticity coordinate and excellent luminous efficiency.

The electron transporting layer 84 may be formed using a dry method, such as resistance heating vacuum deposition, electron beam vacuum deposition, or sputtering; a wet method, such as spin coating or dip coating; or a laser transfer method to be formed as a thin film. Here, the dry method is preferred.

Various methods can be used to differentiate the thickness in respective color regions R, G, and B according to the present invention. For example, an electron transporting layer 84 is first formed on a blue emission region B with a corresponding thickness, the blue emission region B is then masked, and the electron transporting layer 84 is formed in red and green emission regions R, and G. Alternatively, the blue emission region B is first masked, the electron transporting layer 84 is formed in the red and green emission regions R, and G with a corresponding thickness, the red and green emission regions R, and G are masked, and the electron transporting layer 84 is formed in the blue emission layer with a corresponding thickness. It is also possible to mask the red, green and blue emission regions R, G, and B separately and form the electron transporting layer 84 with different thickness according to the regions.

As such, if the thickness of electron transporting layer 84 in the red and green emission regions R, and G is different from that in the blue emission region B, it is possible to obtain the same chromaticity coordinates in the red, green and blue emission regions R, G, and B and simultaneously improve the luminous efficiency for the red and green colors, compared with conventional full color organic electroluminescence display devices. As a result of measuring and comparing the chromaticity and luminous efficiency between an experiment example according to the present invention, wherein the electron transporting layer 84 has different thickness in respective color regions R, G, and B, and a comparative example according to the prior art, wherein the electron transporting layer has the same thickness, it has been confirmed that the experiment example has the same chromaticity coordinates as in the comparative example, while the luminous efficiency for the red and green colors thereof is improved.

The electron transporting layer 84 may be formed of any substance which is commonly used in the field and is not limited in the present invention. For example, an inorganic substance such as LiF and Ca; a quinolinol derivative metal complex such as Alq3 (tris (8-quinolinol) aluminium); an oxadiazole derivative such as 2,5-bis(1-naphthyl)-1,3,4-exadiazole (BND) and 2-(4-tert-butylphenyl)-5-(4-biphenylyl)-1,3,4-oxadiazole (PBD); or a triazole derivative may be used.

Figure 4D:
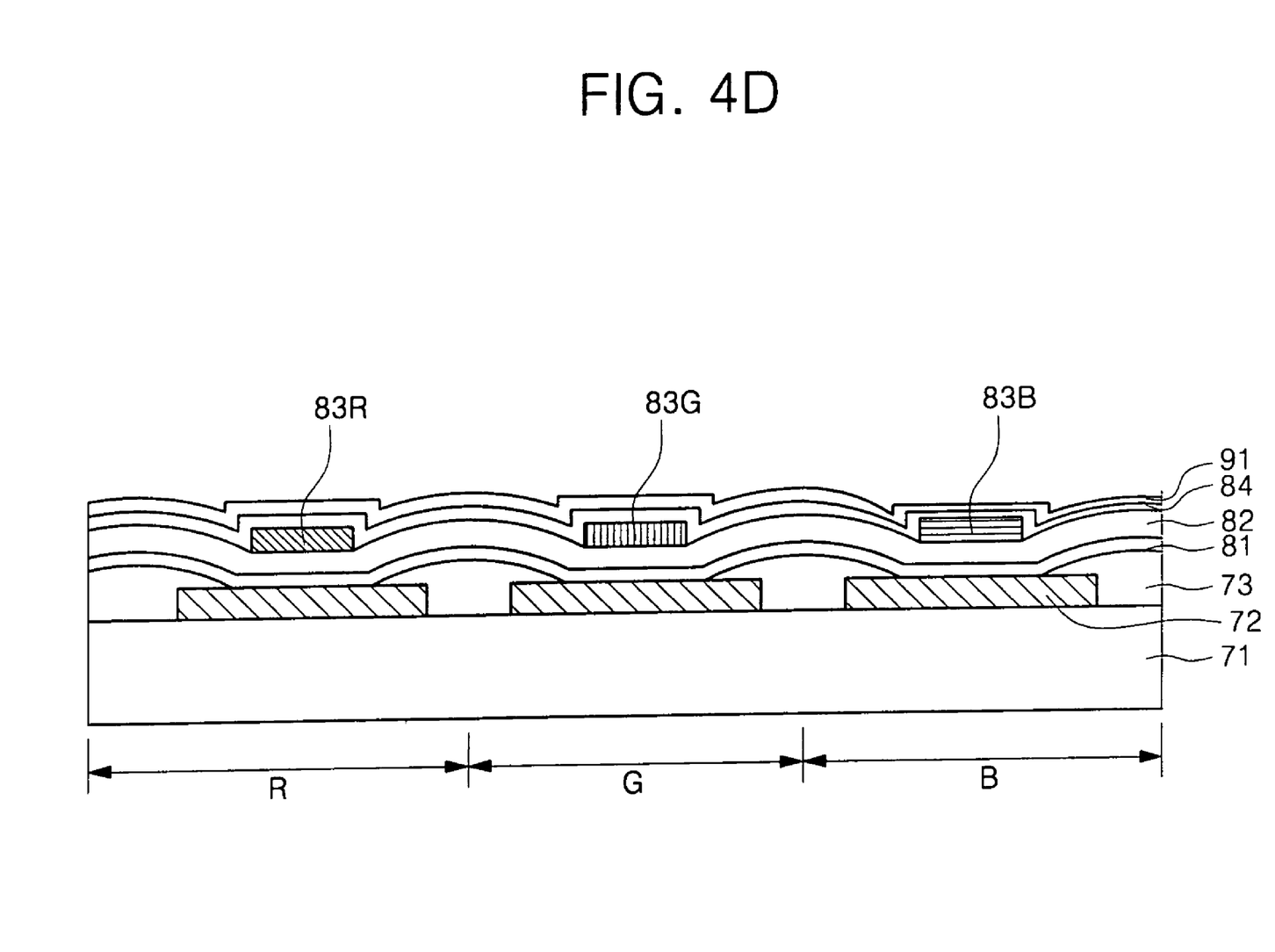

Referring to FIG. 4D, a second layer 91 is formed as a cathode electrode on the electron transporting layer 84. After the second electrode layer 91 is deposited, a passivation layer (not shown) is deposited using a sputtering method to complete a full color organic electroluminescence display device. The passivation layer is preferably made of a transparent inorganic substance, such as $SiO_2$ or $Y_2O_3$.

The organic film layers may additionally include a hole blocking layer and/or an electron injecting layer between the red, green and blue emission layers 83R, 83G, and 83B and the second electrode layer 91, if necessary. The respective layers may be formed of conventional substances. For example, the hole blocking layer may be formed of a low-molecular weight substance, such as Alq3, BCP, CF-X, or TAZ, spiro-TAZ, and the electron injecting layer may be formed of a low-molecular weight substance, such as Alq3, Ga complex, PBD, or an oxadiazole-based high-molecular weight substance. The layers can be formed using commonly used coating methods, such as spin coating or dip coating; an extrusion, spin, or knife coating method; or a deposition method, such as a vacuum deposition method or a chemical vapor deposition method.

The full color organic electroluminescence display device manufactured by the above method according to the present invention has an electron transporting layer 84, which has a first thickness in the red and green emission regions R and G and a second thickness, which is different from the first thickness, in a blue emission region B, so that it has improved luminous efficiency for red and green colors compared with conventional devices, while having the same chromaticity coordinates.

In the above embodiment of the full color organic electroluminescence display device, the first electrode layer 71 is an anode electrode and the second electrode layer 91 is a cathode layer. For an embodiment wherein the first electrode layer 71 is a cathode electrode and the second electrode layer 91 is an anode layer, the organic layers are formed in the opposite order.

Specifically, when the organic film layers include a hole injecting layer, a hole transporting layer, a hole blocking layer, and an electron transporting layer, and first electrode layer 71 is a cathode layer, the hole blocking layer and the electron injecting layer are stacked between the first electrode layer and the emission layer and the hole injecting layer and the hole transporting layer are stacked between the emission layer and the second electrode.

Such a structure may be suitably applied to an active matrix organic electroluminescence display device including a thin film transistor, as well as to a passive matrix organic electroluminescence display device including no thin film transistor.

A preferred example of the present invention will now be presented. However, the example is only for better understanding the present invention and the present invention is not limited by the example in any way.

The full color organic electroluminescence display devices, which are manufactured in the following experimental example and comparative example, are bottom-emitting full color organic electroluminescence display devices and have a first electrode, which is a transparent electrode, and a second electrode, which is a reflective electrode. Between the first and second electrodes, a hole injecting layer; a hole transporting layer; red, green and blue emission layers; a hole blocking layer; and an electron transporting layer are stacked successively.

EXAMPLE

Initially, ITO was formed on a prepared glass substrate and patterned to form a first electrode layer.

Then, copper phthalocyanine (CuPc) was deposited to a thickness of 10 nm in a vacuum of $10^{-6}$ torr to form a hole injecting layer.

Subsequently, N,N'-di(1-naphtyl)-N,N'-diphenylbenzidine (NPD) was deposited on the hole injecting layer to a thickness of 50 nm in a vacuum of $10^{-6}$ torr to form a hole transporting layer.

Subsequently, 10% tris(1-phenylquinoline) iridium in carbazole biphenyl was deposited in a red emission region on the hole transporting layer to form a red emission layer with a thickness of 30 nm.

Then, 5% tris(2-phenylpyridine) iridium was deposited in a green emission region on the hole transporting layer to form a green emission layer with a thickness of 30 nm.

Next, a host/dopant of 5% distyrylanthracene/anthracene-diphenylamine was deposited in a blue emission region to form a blue emission layer with a thickness of 30 nm.

After the red, green and blue emission layers were formed, a hole blocking layer was deposited as a common layer on the emission layers under a vacuum of $10^{-6}$ torr to a thickness of 5 nm using biphenoxy-bi(8-quinolinolato)aluminium (BAlq).

Next, an electron transporting layer was deposited on the hole blocking layer using tris(8-quinolinolato)Aluminium (Alq) under a vacuum of $10^{-6}$ torr with a thickness of 40 nm in the red and green emission regions and with a thickness of 20 nm in the blue emission region.

After the electron transporting layer was deposited, an electron injecting layer was deposited to a thickness of 1 nm using LiF and Al as a reflective layer was deposited on the electron injecting layer to a thickness of 300 nm to form a second electrode. Finally, the upper portion of the second electrode was encapsulated by a metal can and barium oxide to complete a test cell.

COMPARATIVE EXAMPLE

The Comparative Example was manufactured by the same method as the Example, except that the electron transporting layer had a constant thickness.

Initially, ITO was formed on a prepared glass substrate and patterned to form a first electrode layer.

Then, copper phthalocyanine (CuPc) was deposited to a thickness of 10 nm under a vacuum of $10^{-6}$ torr to form a hole injecting layer.

Subsequently, N,N'-di(1-naphtyl)-N,N'-diphenylbenzidine (NPD) was deposited on the hole injecting layer to a thickness of 50 nm under a vacuum of $10^{-6}$ torr to form a hole transporting layer.

Subsequently, 10% tris(1-phenylquinoline) iridium in carbazole biphenyl was deposited in a red emission region on the hole transporting layer to form a red emission layer with a thickness of 30 nm.

Then, 5% tris(2-phenylpyridine) iridium was deposited in a green emission region on the hole transporting layer to form a green emission layer with a thickness of 30 nm.

Next, a host/dopant of 5% distyrylanthracene/anthracene-diphenylamine was deposited in a blue emission region on the hole transporting layer to form a blue emission layer with a thickness of 30 nm.

After the red, green and blue emission layers were formed, a hole blocking layer was deposited as a common layer on the emission layers under a vacuum of $10^{-6}$ torr to a thickness of 5 nm using biphenoxy-bi(8-quinolinolato)aluminium (BAlq).

Next, an electron transporting layer was deposited to a thickness of 20 nm on the red, green and blue pixel regions using tris(8-quinolinolato)Aluminium (Alq) under a vacuum of $10^{-6}$ torr.

After the electron transporting layer was deposited, an electron injecting layer was deposited to a thickness of 1 nm using LiF and a reflective electrode was deposited on the electron injecting layer to a thickness of 300 nm using Al to form a second electrode. Finally, the upper portion of the second electrode was encapsulated by a metal can and barium oxide to complete a test cell.

Test

Efficiency in respective emission regions, driving voltage, and chromaticity coordinates of each of the test cells of the Example and the Comparative Example, were measured and are provided in Table 1 below.

TABLE 1

|  |  | Example | | | Comparative Example | | |
| --- | --- | --- | --- | --- | --- | --- | --- |
|  |  | R | G | B | R | G | B |
| Efficiency (cd/R) |  | 12 | 29.5 | 5.5 | 9 | 25 | 5.5 |
| Driving voltage (V) (500 cd/m$^2$) |  | 7.1 | 6.8 | 6.5 | 6.9 | 6.5 | 6.5 |
| Chromaticity coordinates | CIEx | 0.62 | 0.29 | 0.15 | 0.62 | 0.29 | 0.15 |
|  | CIEy | 0.37 | 0.63 | 0.13 | 0.37 | 0.63 | 0.13 |

Comparing the Example with the Comparative Example, based on the above table, it is clear that they have the same blue luminous efficiency. This means that the thickness of the electron transporting layer, as suggested by the present invention, is appropriate. In addition, the red luminous efficiency is 12 in the case of Example and 9 in the case of Comparative Example. This means that the efficiency is improved by about 33% by setting the thickness of the electron transporting layer. The green luminous efficiency is 29.5 in the former case and 25 in the latter case, which also means that the efficiency is improved by about 18%.

Meanwhile, although the driving voltage values of the red and green emission layers of Example are slightly larger than those of the Comparative Example, this difference can be neglected.

In addition, the measurements of chromaticity coordinates show that the red color, the green color, and particularly the blue color, which is sensitive to the thickness of the electron transporting layer, have the same chromaticity coordinates between the Example and the Comparative Example.

As a result of the above experiment, it has been confirmed that, although the thickness of the electron transporting layer in the red and green emission regions is different from that in the blue emission region, for the present invention, it is still possible to improve the efficiency, compared with the prior art, while obtaining the same chromaticity coordinates.

As mentioned above, the thickness of the electron transporting layer, which is applied as a common layer, has different thickness in respective emission regions in the full color organic electroluminescence display device of the present invention. This maximizes the efficiency of red, green and blue emission layers. Therefore, it is possible to improve the luminous efficiency of red and green colors, compared with conventional devices, while obtaining the same chromaticity coordinates.

Although a preferred embodiment of the present invention has been described for illustrative purposes, it is apparent to those skilled in the art that various modifications, additions and substitutions are possible, without departing from the scope and spirit of the invention as disclosed in the accompanying claims.

What is claimed is:

1. A full color organic electroluminescence display device having a display region comprising a plurality of pixel regions, the display device comprising:
    a substrate;
    a first electrode layer on the substrate, comprising a plurality of electrodes extending across the display region to correspond to lines of the pixel regions;
    emission layers in red, green and blue emission regions and on the first electrode layer and having a pattern corresponding to the pixel regions;
    a common electron transporting layer on the emission layers and on an entire surface of the substrate, the common electron transporting layer having a first thickness in the red and green emission regions and a second thickness, which is different from the first thickness, in the blue emission region; and
    a second electrode layer on the electron transporting layer.

2. The full color organic electroluminescence display device as claimed in claim 1, wherein the electron transporting layer has a thickness of between 30 and 40 nm in the red and green emission regions and a thickness of between 15 and 30 nm in the blue emission region.

3. The full color organic electroluminescence display device as claimed in claim 1, wherein the electron transporting layer comprises a material selected from the group consisting of inorganic substances of LiF and Ca;
    a quinolinol derivative metal; an oxadiazole derivative; and a triazole derivative.

4. The full color organic electroluminescence display device as claimed in claim 1, wherein the electron transporting layer is formed by a method selected from the group consisting of a dry method of resistance heating vacuum deposition, an electron beam vacuum deposition method, and a sputtering method; a wet method of spin coating, dip coating, and inkjet type; and a laser transfer method.

5. The full color organic electroluminescence display device as claimed in claim 1, wherein the electron transporting layer is formed using a dry method.

6. The full color organic electroluminescence display device as claimed in claim 1, wherein one of the first and second electrode layers is selected from the group consisting of a cathode electrode and an anode electrode.

7. The full color organic electroluminescence display device as claimed in claim 1, wherein one of the first and second electrode layers is selected from the group consisting of a reflective electrode and a transparent electrode.

8. The full color organic electroluminescence display device as claimed in claim 1, further comprising at least one layer selected from the group consisting of a hole injecting layer, a hole transporting layer, a hole blocking layer, and an electron injecting layer between the first and second electrode layers.

9. A method for manufacturing a full color organic electroluminescence display device, the method comprising:
    forming first electrodes on a substrate;

defining pixel regions and forming an insulating layer between the first electrodes so as to be partly superimposed on both ends of each first electrode and to have emission regions opened;

forming red, green and blue emission regions at each of the pixel regions by utilizing respective emission substances and patterning the emission substances to form emission layers;

forming a common electron transporting layer on an entire surface of the substrate, the common electron transporting layer having a first thickness in the red and green emission regions and a second thickness, which is different from the first thickness, in the blue emission region; and forming a second electrode on the electron transporting layer.

10. The method as claimed in claim 9, wherein the electron transporting layer has a thickness of between 30 and 40 nm in the red and green emission regions and a thickness of between 15 and 30 nm in the blue emission region.

11. The method as claimed in claim 9, wherein the electron transporting layer is formed by a method selected from the group consisting of a dry method of resistance heating vacuum deposition, an electron beam vacuum deposition method, and a sputtering method; a wet method of spin coating, dip coating, and inkjet type; and a laser transfer method.

12. The method as claimed in claim 11, wherein the electron transporting layer is formed with a dry method.

13. The method as claimed in claim 9, wherein the electron transporting layer is formed by a method selected from the group consisting of:

a method wherein the electron transporting layer is formed on the blue emission region, the blue emission region is masked, and the electron transporting layer is formed in the red and green emission regions;

a method wherein the blue emission region is masked, the electron transporting layer is formed on the red and green emission regions, the red and green emission regions are masked, and the electron transporting layer is formed on the blue emission region; and a method wherein the red, green and blue emission regions are masked separately and the electron transporting layer is formed on the regions independently.

14. The method as claimed in claim 9, wherein at least one layer is additionally formed between the first and second electrode layers, the layer being selected from the group consisting of a hole injecting layer, a hole transporting layer, a hole blocking layer, and an electron injecting layer.

15. The method as claimed in claim 9, further comprising:
forming an electron injecting layer between the emission layers and the second electrode.

16. A full color organic electroluminescence display device having a display region comprising a plurality of pixel regions, the display device comprising:

a substrate;

a first electrode layer on the substrate, comprising a plurality of electrodes extending across the display region to correspond to lines of the pixel regions;

emission layers in red, green and blue emission regions, the emission layers being on the first electrode layer;

a common electron transporting layer on the emission layers, the electron transporting layer in the red and green emission regions being thicker than that in the blue emission region; and a second electrode layer on the electron transporting layer, wherein the common electron transporting layer has identical thickness in the red and green emission regions.

* * * * *

UNITED STATES PATENT AND TRADEMARK OFFICE
CERTIFICATE OF CORRECTION

PATENT NO. : 7,833,633 B2
APPLICATION NO. : 10/903697
DATED : November 16, 2010
INVENTOR(S) : Jun-Yeob Lee et al.

It is certified that error appears in the above-identified patent and that said Letters Patent is hereby corrected as shown below:

On the Title Page

Item (56) References Cited, OTHER PUBLICATIONS, Column 2, line 2     Delete "Jul. 3, 2003;" Insert -- Mar. 7, 2003; --

Signed and Sealed this
Twenty-ninth Day of May, 2012

David J. Kappos
*Director of the United States Patent and Trademark Office*